United States Patent [19]

Zhang et al.

[11] Patent Number: 5,580,800
[45] Date of Patent: Dec. 3, 1996

[54] METHOD OF PATTERNING ALUMINUM CONTAINING GROUP IIIB ELEMENT

[75] Inventors: Hongyong Zhang; Yasuhiko Takemura; Hideki Uochi; Itaru Koyama; Minoru Miyazaki; Akane Murakami; Toshimitsu Konuma; Akira Sugawara; Yukiko Uehara, all of Kanagawa, Japan

[73] Assignee: Semiconductor Energy Laboratory Co., Ltd., Japan

[21] Appl. No.: 213,060

[22] Filed: Mar. 15, 1994

[30] Foreign Application Priority Data

| Mar. 22, 1993 | [JP] | Japan | 5-086750 |
| Mar. 22, 1993 | [JP] | Japan | 5-086751 |
| Mar. 22, 1993 | [JP] | Japan | 5-086752 |
| Sep. 27, 1993 | [JP] | Japan | 5-263024 |

[51] Int. Cl.$^6$ .................. H01L 21/28; H01L 21/306; H01L 21/3213
[52] U.S. Cl. .................. 437/40; 437/194; 437/245; 437/228; 148/DIG. 51; 156/634.1; 156/638.1
[58] Field of Search .................. 437/21, 40, 41, 437/236, 237, 225, 228, 245, 194; 148/DIG. 51; 156/638.1, 634.1, 656.1

[56] References Cited

U.S. PATENT DOCUMENTS

| 4,415,606 | 11/1983 | Cynkar .................. 437/198 |
| 4,681,657 | 6/1987 | Hwang et al. .................. 156/657 |
| 5,308,998 | 5/1994 | Yamazaki et al. . |
| 5,359,206 | 10/1994 | Yamamoto et al. .................. 257/59 |

FOREIGN PATENT DOCUMENTS

| 56-138929 | 10/1981 | Japan . |
| 61-052376 | 3/1986 | Japan . |
| 62-125633 | 6/1987 | Japan . |
| 62-211391 | 9/1987 | Japan . |
| 1-268840 | 10/1989 | Japan . |
| 3-287797 | 12/1991 | Japan . |
| 4-250626 | 9/1992 | Japan . |
| 5-152573 | 6/1993 | Japan . |
| 5-299655 | 11/1993 | Japan . |
| 6-267959 | 9/1994 | Japan . |

OTHER PUBLICATIONS

Translation of 5–299655 Nov. 1993.
Full text of the Ganiev (2), Sokol and Labunov articles, whose abstracts were provided with Paper No. 9 Mar. 1984.
Ganiev, I. N., et al., J. Appl. Chem. USSR, 58,10(1985)2366 "Effect of Lanthanum . . . on the Anodic Behavior of Al . . . .".
Ganiev, I. N., et al., J. Appl. Chem. USSR, 60,9(1987)2119 "Anodic Behavior of Al:Sc (Y) Alloys . . . ".
Labunov, V. A., et al., Dokl. Akad. Nauk, BSSR, 28,3(1984)215 ". . . Anions into an Anodic Oxide Film on Al".
Sokol, V. A., et al., Vestsi Akad. Nauk BSSR, 4(1988) 106 "Anodic Oxide Films on Al Containing Rare Earth Metals".
Translation of JP 56–138929.
Full text of the Tsutsu Article Cited in Previous Action.
H. Tsutsu, et al., 1992 Proc. Electrodreur SOC (TFT Symp), p. 138, ". . . Etching Technology of Al–2% Si Alloy".
S. Wolf & R. N. Tauber "Silicon Processing for the VLSI ERA", 1986 pp. 531–532, 534–535, vol. I.

Primary Examiner—Tom Thomas
Assistant Examiner—Leon Radomsky
Attorney, Agent, or Firm—Sixbey, Friedman, Leedom & Ferguson, PC; Gerald J. Ferguson, Jr.; Jeffrey L. Costellia

[57] ABSTRACT

A thin film transistor according to this invention has a gate electrode comprising a lower layer of aluminum of a high purity of over 99.5% and an upper layer of aluminum containing over 0.5% silicon. Alternatively, it has a gate electrode made by adding a IIIa group element to a IIIb group element. Residues produced by the etching of the silicon-containing aluminum gate electrode are etched with a mixture solution of hydrofluoric acid, nitric acid and acetic acid. After contact holes have been formed in an interlayer insulating film, laser annealing is carried out, and metal electrodes are formed in the contact holes thereafter.

11 Claims, 11 Drawing Sheets

METHOD OF PATTERNING ALUMINUM CONTAINING GROUP IIIB ELEMENT

BACKGROUND OF THE INVENTION

This invention relates to a method for producing a thin film transistor (TFT) having a noncrystal semiconductor thin film. A thin film transistor manufactured according to this invention may be formed on an insulating substrate such as glass or on a semiconductor substrate such as monocrystalline silicon.

DESCRIPTION OF THE PRIOR ART

Recently, research has been being carried out on insulated gate-type semiconductor devices having thin film-form active layers (also called active regions) on insulating substrates. In particular, thin film insulated gate transistors, or so-called thin film transistors (TFTs), have been being researched intensively. These are divided up according to the material and crystal state of the semiconductor used into types such as amorphous silicon TFTs and crystalline silicon TFTs.

Crystalline semiconductors have greater electric field mobility than amorphous semiconductors and therefore are capable of operating at high speeds. Also, with crystalline silicon, because not only NMOS TFTs but also PMOS TFTs can be similarly obtained, it is possible to create CMOS circuits. Because of this, particularly TFTs made using crystal silicon have recently been being heavily researched.

In crystal semiconductors, as a gate electrode material, the use of aluminum has been being researched because it has the merit that its sheet resistance is low. However, with pure aluminum, in heat treatment at over 100° C., hillocks have formed. These hillocks have not been so much of a problem in devices of channel length over 10 µm, but in devices of lower channel length, and typically in 2 to 10 µm devices, they have led to irremediable defects.

Because of this, a material made by adding over 0.5% and preferably over 2% silicon to aluminum to suppress the occurrence of hillocks has usually been used. The method by which this kind of gate electrode is formed is shown in FIGS. 2(A) and 2(B). On a substrate 11, a base insulating film 12 is deposited, an island-shaped silicon region 13 is formed, a gate insulating film 14 is deposited covering this, and then an aluminum film 15 is deposited by vacuum deposition or by sputtering. (FIG. 2(A))

Patterning is then carried out by a known photolithography method, the aluminum film 15 is etched, and a gate electrode 15a is formed. For the etching, from the mass-production viewpoint, wet etching using an acid such as phosphoric acid has been used. However, with this kind of etching, a residue deposit such as that shown by reference numeral 16 in FIG. 2(B) has been observed. This deposit has silicon as its main component and is silicon which has remained without being etched, or is a product of coagulation of aluminum silicide, in the etching step. (FIG. 2(B))

To remove this deposit 16, treatment with an acid containing hydrofluoric acid has been necessary, but this treatment has inflicted damage on the gate insulating film 14 (usually silicon oxide) or the activate region (usually silicon) below. That is, the gate insulating film or the active region has undergone significant etching, and, as a result, in cases such as when the gate electrode is later anodically oxidized, holes have opened up between the anodic oxide of the gate electrode and the gate insulating film and reliability has been reduced. Consequently, the selective removal of this kind of residue only has been being sought. This invention was devised in view of this problem and provides a method of selectively etching deposits while maintaining mass-production.

TFTs can be used as pixel electrode switching elements in active matrix liquid crystal displays, or as driving elements in peripheral driver circuits. They can also be used for image sensors and for other integrated circuits.

As a TFT structure, the structure illustrated in FIG. 8 has been proposed. The TFT shown in FIG. 8 has an active layer comprising a noncrystalline or crystalline silicon thin film formed on a glass substrate 111 and having a source 112, a drain 114 and a channel 113, a silicon oxide film constituting a gate insulating layer 116, a gate electrode 117 whose main component is aluminum and a silicon oxide layer 118 on the periphery thereof, an interlayer insulating film 119, a source electrode 101 and a drain electrode 102.

Here, crystalline silicon film refers to a film such as microcrystal silicon film, polycrystalline silicon film or semi-amorphous silicon film which has silicon containing an ordered structure as its main component.

What is important in the structure illustrated in FIG. 8 is that the thickness of the oxide layer 118 formed on the periphery of the gate electrode 117 is used to form offset gate regions 115. In the structure shown in FIG. 8, the source 112 and the drain 114 are formed by ion implantation or by ion doping, and in this the gate electrode 117 and the oxide layer 118 thereon serve as a mask.

As a result, as shown by the reference numeral 115, on both sides of the portion 113 which functions as a channel, regions which function neither as a channel nor as a source/drain, or which function as both, are formed. These regions 115 are called offset gate regions and serve the purpose of acting to alleviate electrical field concentrations between the channel and the source and between the channel and the drain. By providing these offset gate regions it is possible to obtain benefits such as reductions in the OFF current during reverse bias application and increases in the ON-OFF ratio.

Reversely, it is possible to some extent to control the TFT characteristics by way of the width 103 of these offset regions 115 (which thickness is determined by the thickness of the oxide layer 118). Accordingly, when the thickness of the oxide layer 118 cannot be well controlled, variations occur in the characteristics of the TFTs.

The oxide layer 118 is formed after the formation of the aluminum gate electrode 117 by for example immersing the substrate in a 3% solution of tartaric acid in ethylene glycol (pH-adjusted to neutral with ammonia) and increasing a voltage across the gate electrode 117 at 1 to 5 V/min, for example 4 V/min, to 120 V.

In general, the thickness of the oxide layer 118 is set to approximately 1000 to 2000 Å. This results in the thickness 103 of the offset gate regions 115 being 500 Å to 1 µm, for example 1000 to 2000 Å. Of course, the thickness of the offset gate regions 115 is decided according to the requirements of the application. However, in the TFT production process heating steps and steps involving irradiation with flash lamp light or laser light are necessary, and in such steps it is necessary that the oxide layer 118 be durable (laser-resistant and heat-resistant).

According to numerous experiments carried out by the present inventors, when pure aluminum is used for the gate electrode there has been the problem that in the anodic oxidation process abnormal growth of the aluminum occurs (hillocks).

Also, it was found that in structures in which an anodic oxide is formed on the surface of an aluminum film obtained in this way, and especially when the anodic oxide film is thin, there is the problem that the resistance to irradiation with strong light such as laser light (the laser-resistance) is poor, and there is no resistance to heat. (That is, hillocks form and the anodic oxide layer breaks up. Especially in heat treatment at over 350° C., hillock formation was marked.)

A cause of the above problem may be that when given a large amount of energy aluminum atoms readily move around at the atomic level. A method of solving this problem might be to add a small quantity of a material whose melting point is higher than that of aluminum and thereby suppress the movement of aluminum at the atomic level. One technique might therefore be to add Si or Pd to the aluminum. The addition of this kind of element suppresses the formation of hillocks and increases the resistance to heat.

However, there is the problem that because the ionization rates of Si and Pd and the like are low compared to that of aluminum, in the anodic oxidation process the anodic oxide layer cannot be made thick. Also, because the oxidation rates of Si, which is a periodic table group IVb element, and Pd, which is a periodic table group VIII element, are lower than the rates at which aluminum oxidizes, there has been the problem that oxidation does not proceed uniformly, the thickness of the oxide layer is not uniform, and it is not possible to form a dense oxide layer (see Eighth Preferred Embodiment). As a result of this, the heat-resistance is actually reduced. Also, when this kind of material is used to make a TFT of the kind shown in FIG. 8, because the thickness of the oxide layer 118 differs from place to place there is the problem that the width of the offset regions 115 also varies.

Crystal silicon is usually obtained by annealing for a long period of time at a temperature of over 600° C., and heat treatment at a similar temperature has also been required to activate the doping impurity in crystal silicon which has been doped by a method such as ion implantation or ion doping. However, because this kind of high-temperature heat treatment reduces the freedom with which the substrate and structural materials of the TFT can be selected, treatment at low temperatures has been being sought.

As a way of reducing the temperatures at which crystallization and activation are carried out, it has been proposed that the silicon film be crystallized and activated by irradiation with a laser or with equivalent strong light. Depending on the name of the light source, this kind of technique is called laser annealing or lamp annealing. Hereinafter, these methods will all be referred to generically as laser annealing.

An example of a TFT manufacturing process involving a step in which a doping impurity in a silicon film is activated using laser annealing is illustrated in FIG. 7. First, a base insulating film 722 is deposited on a substrate 721 and a crystal silicon region 723 is formed on top of that. Either heat annealing or laser annealing is used for crystallization of the silicon film. Then, a gate insulating film 724 is deposited covering this silicon region. A gate electrode 725 is then formed on top of the gate insulating film 724. (FIG. 7(A))

The surface of the gate electrode is then oxidized by anodic oxidation. This is in order to obtain good characteristics by causing the impurity regions (source, drain) and the gate electrode to be offset. Of course, it is not always necessary for this kind of anodic oxide 726 to be formed. (FIG. 7(B))

After that, using a method such as ion implantation or ion doping, through the gate insulation film 724, an impurity is introduced into the silicon region 723. At this time it is necessary for the introduction of the impurity to take place through the gate insulating film in order to increase yields. In this way a source and a drain 727a, 727b are formed. As mentioned above, the impurity regions and the gate electrode do not overlap with each other and are slightly separated by the width of the anodic oxide 726 (i.e. they are offset). (FIG. 7(C))

Activation of the doped impurity is then carried out using a laser or equivalent strong light. At this time, the doping impurity (phosphorus or boron, etc), silicon and silicon oxide combine, and a nonstoichiometric silicon oxide film 728 is formed at the boundary between the silicon region and the gate insulating film 724. (FIG. 7(D))

Finally, contact holes are formed and metal electrodes 730a, 730b are formed on the source and drain; here, it is not possible with a hydrofluoric acid type etchant not containing an oxidizer to satisfactorily remove the nonstoichiometric silicon oxide film 728 formed previously. With a dry etchant, on the other hand, because the etching ratio of silicon oxide and silicon is not so large, especially when the silicon region is thin, the contact holes have sometimes passed right through the silicon region. (FIG. 7(E))

The resistance of this kind of nonstoichiometric silicon oxide film 728 is high, and this has been a cause of poor TFT contacts. An object of this invention is to provide a method of making contacts without this kind of nonstoichiometric silicon oxide film.

SUMMARY OF THE INVENTION

A first aspect of the present invention solves these problems by adopting a multilayer structure of at least 2 layers for the gate electrode, making the lower layer out of an aluminum of a relatively high purity of over 99.5%, and making the upper layer out of an aluminum containing more than 0.5% silicon and preferably more than 2% silicon. With this kind of multilayer film, although residues such as silicon do coagulate up to a point midway through the etching process, in the vicinity of the gate insulating film all the aluminum dissolves and therefore this kind of residue also can be removed without it adhering to the gate insulation film.

As a result, treatment with hydrofluoric acid or the like is not necessary. Therefore, there is almost no effect on the gate insulating film and especially when the gate electrode is to be anodically oxidized thereafter the benefits are great.

Also, with respect to hillocks, it has been found that if the thickness of the aluminum of the upper layer of the gate electrode is made preferably over 5 times the thickness of the aluminum of the lower layer, there is essentially no hillock problem. For this reason, this invention is especially effective in cases involving processes requiring temperatures of over 100° C. and preferably over 250° C.

The invention is conceptually illustrated in FIGS. 1(A) through 1(C). A base insulating film 2 is deposited on a substrate 1, an island-shaped silicon region 3 is formed, and a gate insulating film 4, a lower-layer aluminum film 5 (over 99.5% pure), and an upper-layer aluminum film 6 (containing over 0.5% and preferably over 2% silicon) are deposited covering the island-shaped silicon region 3. (FIG. 1(A))

This is patterned using a commonly known photolithography method and etched with phosphoric acid or the like to form a gate electrode (consisting of an upper-layer film 6a and a lower-layer film 5a). (FIG. 1(B))

Because aluminum reflects light strongly, after the upper-layer aluminum film is formed a film 7 of amorphous silicon or having amorphous silicon as its main component may be formed by sputtering or CVD or the like as an anti-reflection film. (FIG. 1(C))

A second aspect of the invention comprises etching the kind of residue deposits discussed above using a mixture solution (a mixed acid) of hydrofluoric acid, nitric acid and acetic acid. In particular, in this invention, in mole ratio, when the hydrofluoric acid (HF) is 1, the nitric acid ($HNO_3$) is made 100 to 400, and preferably 180 to 220, and the acetic acid ($CH_3COOH$) is made 100 to 300, and preferably 130 to 170.

With acids in this kind of range it takes 30 to 90 seconds to remove the deposits mentioned above; the etching depth of the aluminum at this time was 20 to 60 Å and the etching depth of the silicon oxide was 80 to 240 Å, and compared to the usual thickness of 2000 to 10,000 Å of the aluminum film and the usual thickness 1000 to 2000 Å of the silicon oxide film serving as the gate insulation film almost no substantial adverse effect resulting from this degree of etching was observed.

A third aspect of the invention comprises forming an interlayer insulating film and contact holes before performing laser annealing and performing laser annealing thereafter. In this way, because in the contact hole regions no silicon oxide exists to undergo a reaction, no nonstoichiometric silicon oxide film of the kind mentioned above is formed. After that, reliable contacts are formed by forming metal electrodes in these contact holes.

A fourth aspect of the invention makes it possible for abnormal growth in oxidization steps and heating steps of materials having IIIa group elements as their main components to be prevented, by adding to materials having IIIa group elements as their main components a IIIb group element. The IIIb group elements referred to here are Sc, Y, lanthanoids and actinoids, and the IIIa group elements are B, Al, Ga, In, Tl. In particular, according to this invention Sc (scandium) 0.05 wt % to 0.40 wt %, and preferably 0.1 wt % to 0.25 wt %, is added. When this amount is made less than 0.1 wt %, or still less preferably is made less than 0.05 wt %, the heat-resistance is not satisfactory and hillocks appear within 1 hour at 350° C. To etch these materials, wet etching and dry etching can be used in the same way as has been done conventionally. When dry etching is carried out, when depending on the etching conditions the added elements (scandium, etc) remain as residue, and particularly when the amount of this residue is over 0.40 wt % or even 0.25 wt %, some residue may remain on the surface etched by the dry etching; however, this residue can be removed by washing with pure water.

When this kind of aluminum to which an impurity has been added is used and is anodically oxidized, a dense anodic oxide layer of uniform thickness can be obtained. Furthermore, in the anodic oxidation process, it is also possible to prevent abnormal growth of the aluminum. Besides Sc, Y, La, and lanthanoid can be used. As a result, the anodic oxidation process can be carried out with good controllability and also with good reproducibility, and when this kind of anodic oxidation process is used to make TFTs of the kind shown in FIG. 8 having offset regions, TFTs in which the width of the offset regions is uniform (i.e. TFTs having uniform characteristics) can be obtained.

Sc has an ionization rate higher than that of aluminum, and in the anodic oxidation process does not impede the oxidation of aluminum. Therefore, a dense anodic oxide layer can be formed. And, because the effect of suppressing the movement of aluminum at the atomic level is strong, the formation of hillocks by heating or by the anodic oxidation process can be suppressed. Also, because the anodic oxide layer is dense and its surface is smooth, and because there is no surface irregularity at the interface between the anodic oxide layer and the aluminum film either, the light reflectivity is excellent and the laser-resistance is increased.

The above points also apply to cases in which a thin anodic oxide of thickness less than 300 to 1200 Å is formed. With conventional anodic oxide layers to which Si or Pd has been added it has not been possible to expect heat-resistance or laser-resistance unless the layer exceeds a certain thickness (normally over 2000 Å). This is because there is irregularity in the surface of the anodic oxide as mentioned above and there are also thin places and thick places in the anodic oxide, and heat and laser irradiation cause the anodic oxide layer to break up, starting from the places where it is thin. However, when a IIIa group element of the present invention was added, because the anodic oxidation proceeded uniformly, there was almost no occurrence of irregularity of the kind mentioned above at all. As a result, even when the anodic oxide layer was a thin one of thickness 300 to 1200 Å, an anodic oxide layer having excellent heat-resistance and laser-resistance could be obtained.

DETAILED DESCRIPTION OF THE PREFERRED EMBODIMENTS

First Preferred Embodiment

Figure 1A:
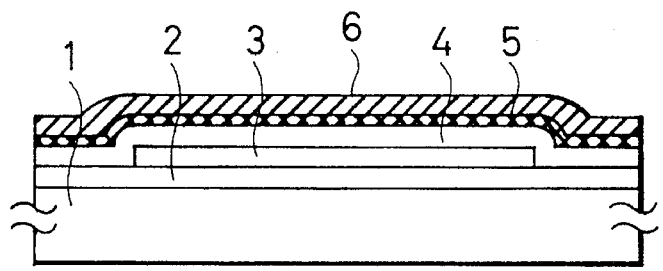
FIGS. 1(A) through 1(C) illustrate an example of the structure of the gate of a TFT according to the present invention.
Figure 1B:
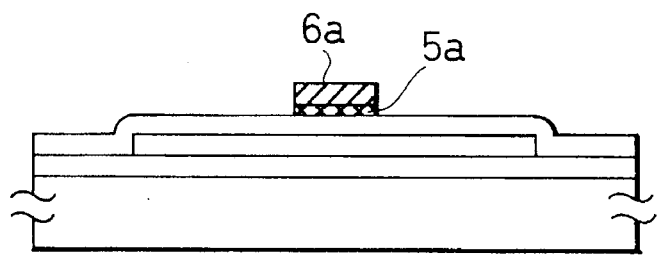
Figure 1C:
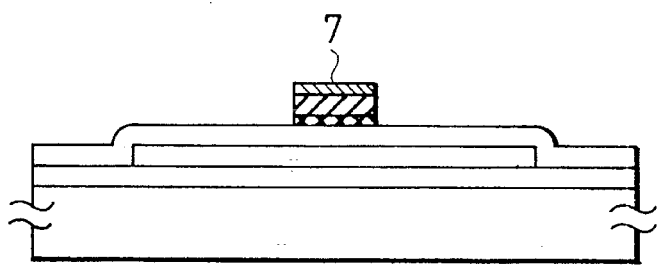
Figure 2A:
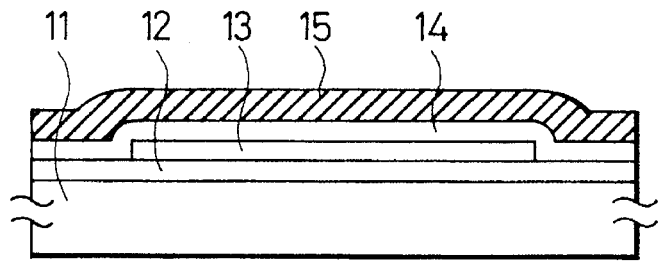
FIGS. 2(A) and 2(B) illustrate an example of the structure of the gate of a conventional TFT.
Figure 2B:
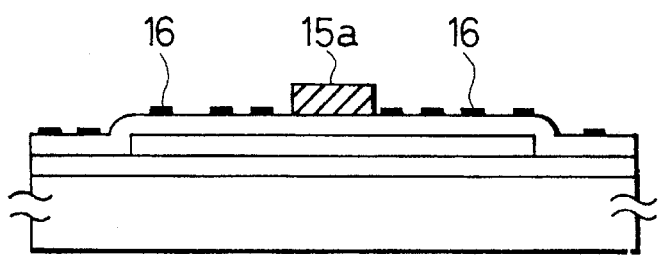
Figure 3A:
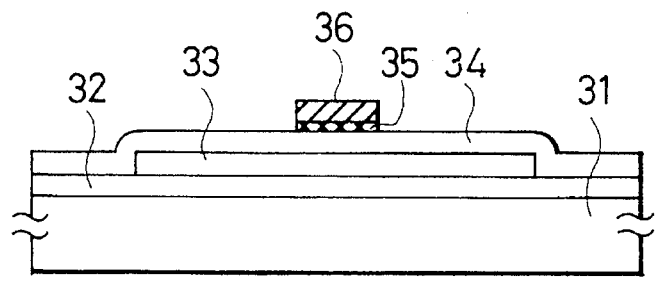
FIGS. 3(A) through 3(E) are cross-sectional views illustrating a manufacturing process according to a first preferred embodiment of the invention.

A manufacturing process according to a first preferred embodiment of the invention is illustrated in FIGS. 3(A)

through 3(E). First, a silicon oxide base film 32 of thickness 2000 Å was formed on a substrate (Corning 7059) 31 by sputtering. Then, by plasma CVD, an intrinsic (I-type) amorphous silicon film of thickness 500 to 1500 Å, for example 1500 Å, and, on top of that, by sputtering, a silicon oxide film of thickness 200 Å, were deposited. This amorphous silicon film was then crystallized by annealing in a nitrogen atmosphere at 600° C. for 48 hours.

After the annealing step, the silicon film was patterned, an island-shaped silicon region 33 was formed, and by sputtering a silicon oxide film 34 of thickness 1000 Å was deposited as a gate insulating film. For the sputtering, silicon oxide was used as a target, the substrate temperature during sputtering was 200° to 400° C., for example 250° C., and the sputtering atmosphere was oxygen and argon in the ratio argon/oxygen=0 to 0.5, for example less than 0.1.

Then, by sputtering, an aluminum film (first aluminum film) of thickness of from 200 to 2000 Å, for example 500 Å, was deposited. The purity of the aluminum was over 99.9%. It is desirable that this silicon oxide film and this aluminum film be formed in consecutive steps. An aluminum film containing 0.5 to 3%, for example 2% silicon (second aluminum film) of thickness of from 1000 to 10,000 Å, for example 5000 Å, was then deposited.

The first and second aluminum films were then patterned to form a gate electrode (consisting of a first aluminum layer 35 and a second aluminum layer 36). (FIG. 3(A))

Figure 3B:
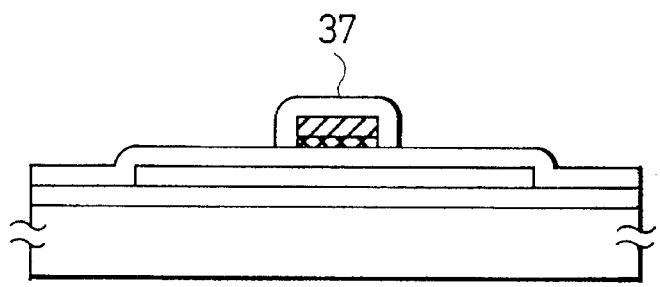

Then, the substrate was immersed in a (1 to 5%) solution of tartaric acid in ethylene glycol, a current was passed through the gate electrode, and an anodic oxide (aluminum oxide) 37 was caused to grow on the surface of the gate electrode. A thickness of the anodic oxide of 1000 to 5000 Å, and particularly 2000 to 3000 Å, was desirable. In this example the thickness was made 2500 Å. (FIG. 3(B))

Figure 3C:
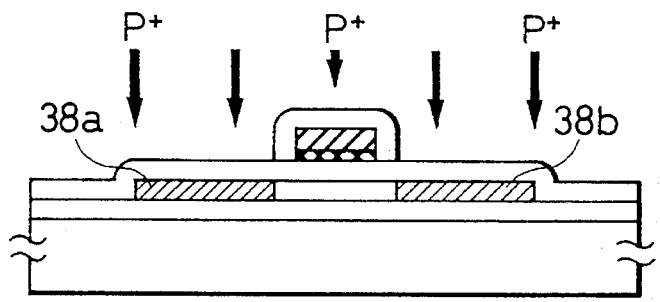

By plasma doping, an impurity (phosphorus) was introduced into the silicon region with the gate electrode and the anodic oxide on the periphery of the gate electrode as a mask. Phosphine ($PH_3$) was used as the doping gas, and the accelerating voltage was made 60 to 90 kV, for example 80 kV. The dose quantity was $1 \times 10^{15}$ to $8 \times 10^{15}$ $cm^{-2}$, for example $2 \times 10^{15}$ $cm^{-2}$. As a result, N-type impurity regions 38a, 38b were created. (FIG. 3(C))

Figure 3D:
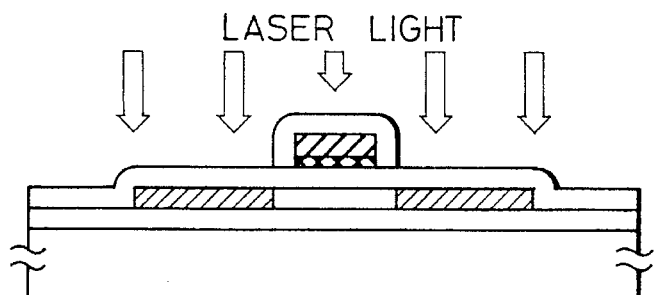

After that, laser annealing was carried out by irradiation with laser light. A KrF excimer laser (wavelength 248 nm, pulse width 20 nsec) was used as the laser, but other lasers, for example an XeF excimer laser (wavelength 353 nm), an XeCl excimer laser (wavelength 308 nm), or an ArF excimer laser (wavelength 193 nm), may be used. The laser energy density was made 200 to 500 $mJ/cm^2$, for example 250 $mJ/cm^2$, and 2 to 10 shots, for example 2 shots, of irradiation were carried out per location. For the laser irradiation, the substrate was heated to 100° to 450° C., for example 250° C. In this way, the impurity was activated. (FIG. 3(D))

Figure 3E:
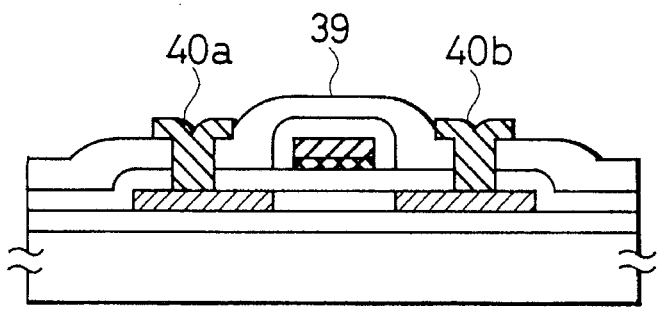
Figure 4A:
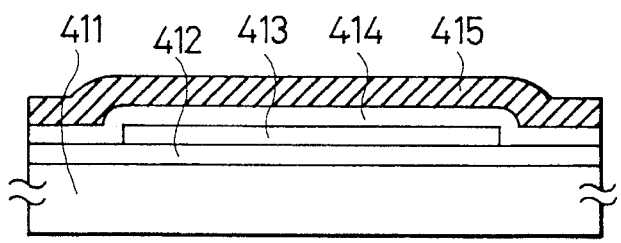
FIGS. 4(A) through 4(F) are cross-sectional views illustrating a manufacturing process according to a third preferred embodiment of the invention.
Figure 4B:
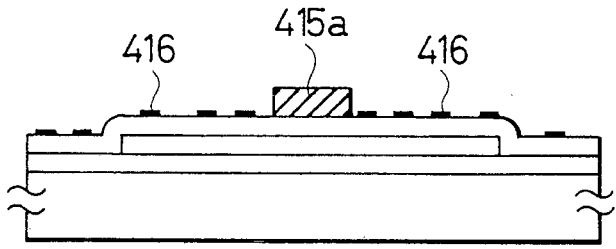
Figure 4C:
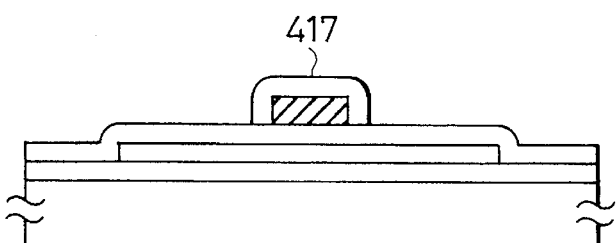
Figure 4D:
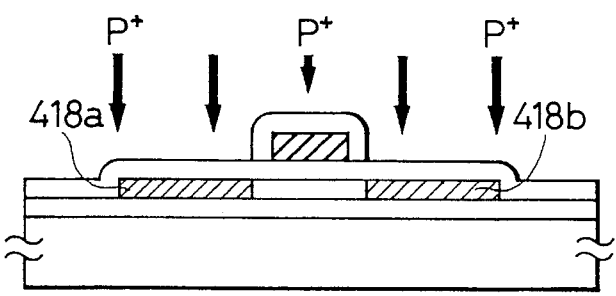
Figure 4E:
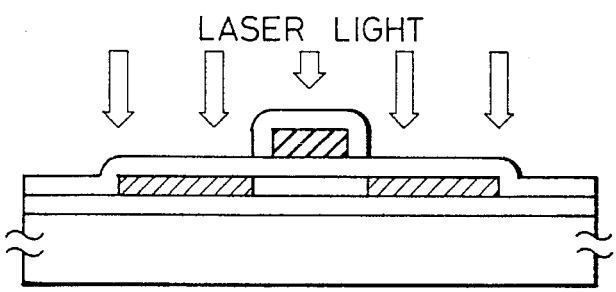
Figure 4F:
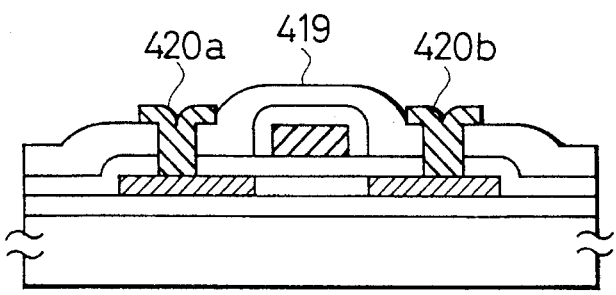
Figure 5A:
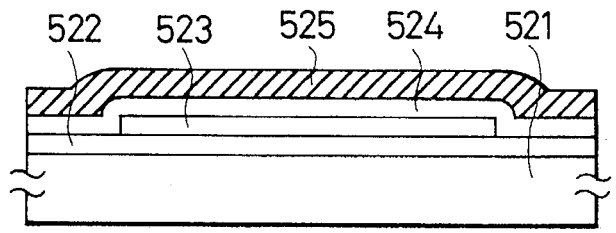
FIGS. 5(A) through 5(F) are cross-sectional views illustrating a manufacturing process according to a fourth preferred embodiment of the invention.
Figure 5B:
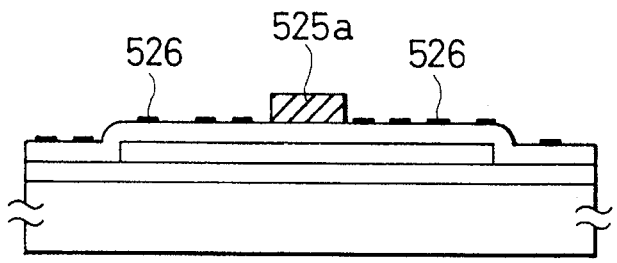
Figure 5C:
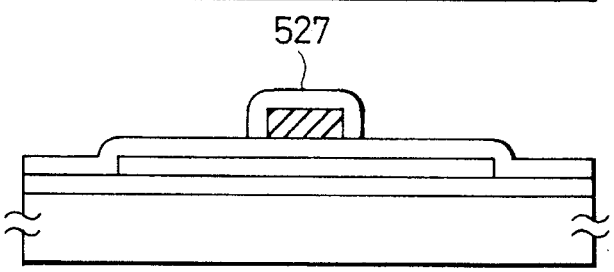
Figure 5D:
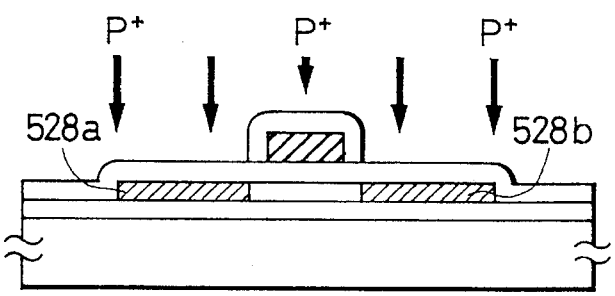
Figure 5E:
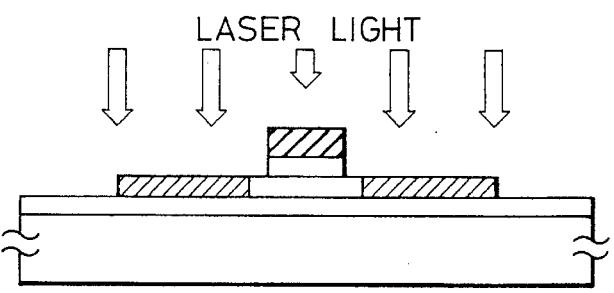
Figure 5F:
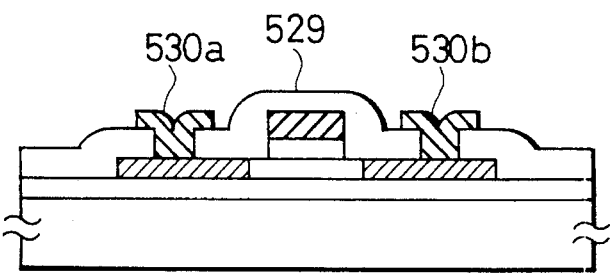
Figure 6A:
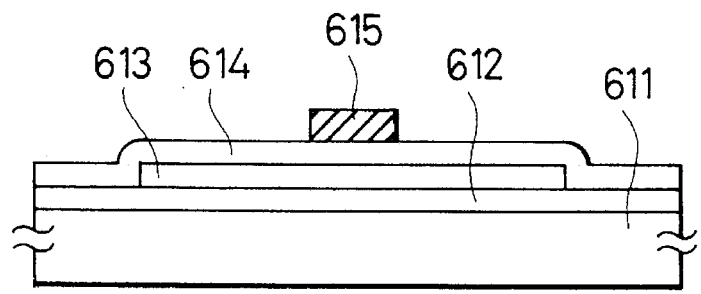
FIGS. 6(A) through 6(E) are cross-sectional views illustrating a TFT manufacturing process according to a fifth preferred embodiment of the invention.
Figure 6B:
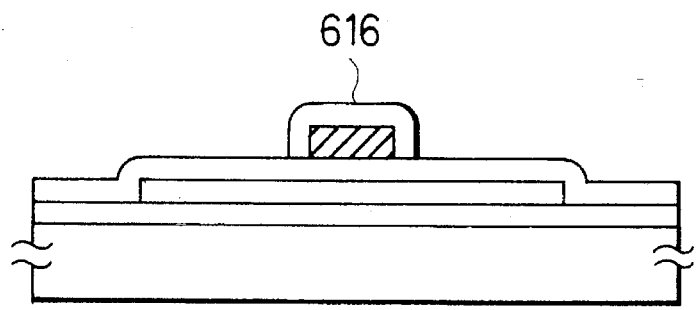
Figure 6C:
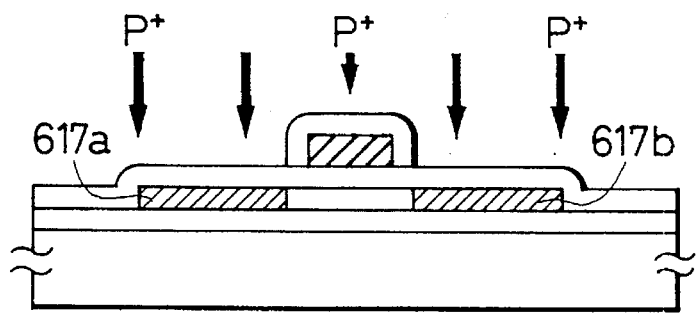
Figure 6D:
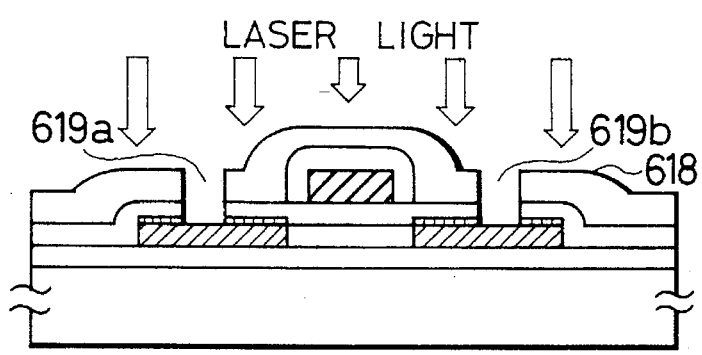
Figure 6E:
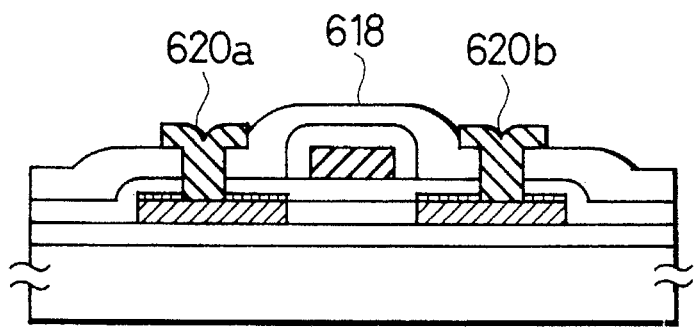
Figure 7A:
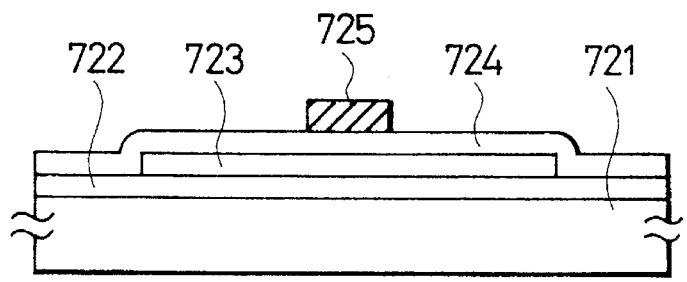
FIGS. 7(A) through 7(E) are cross-sectional views illustrating a conventional TFT manufacturing process.
Figure 7B:
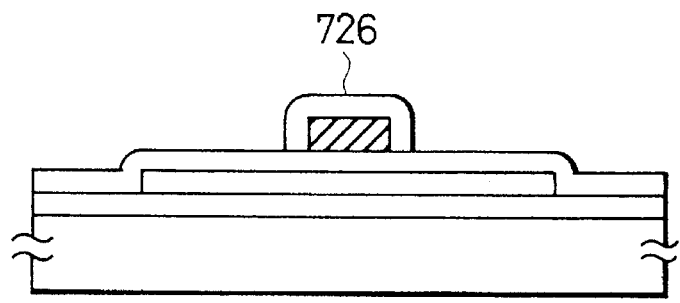
Figure 7C:
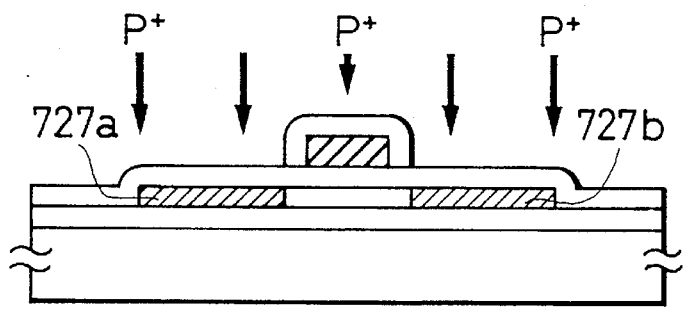
Figure 7D:
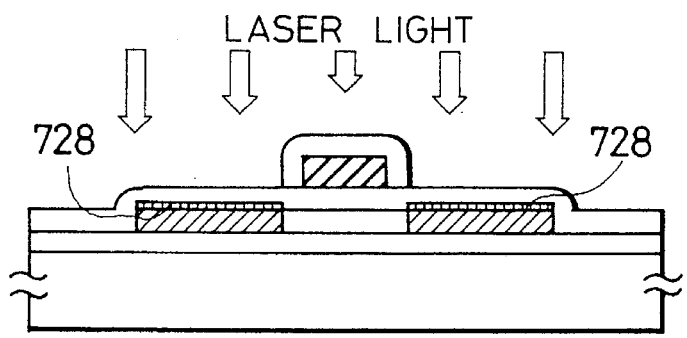
Figure 7E:
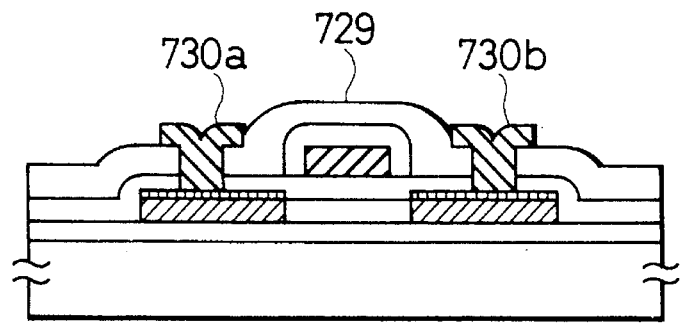
Figure 8:
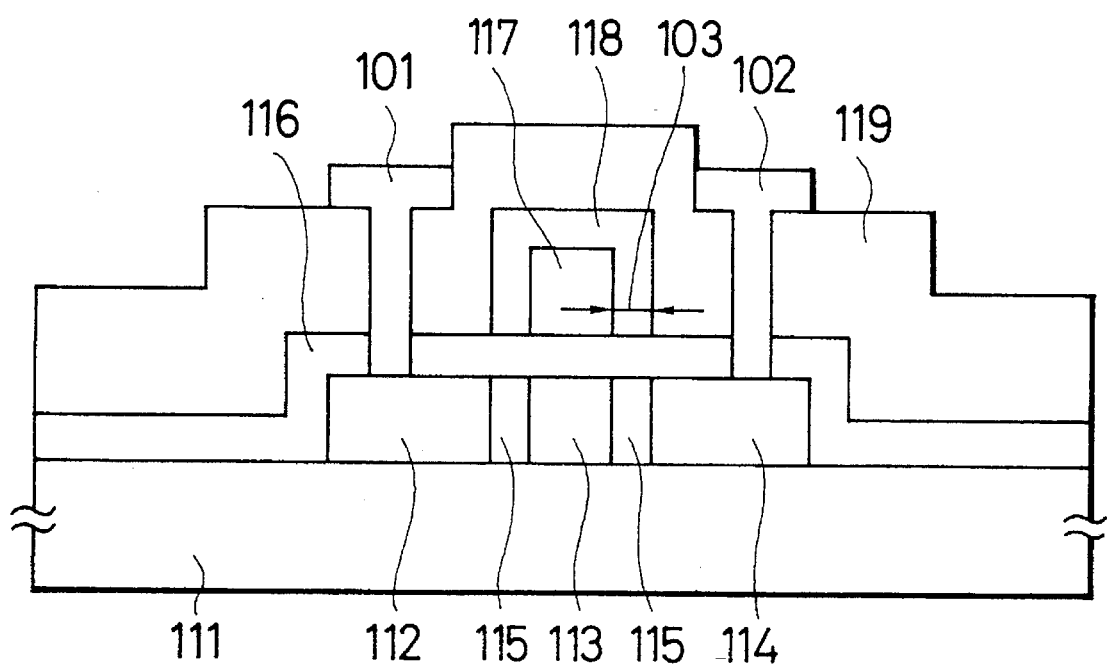
FIG. 8 is a view illustrating the structure of a TFT having offset gate regions.
Figure 9A:
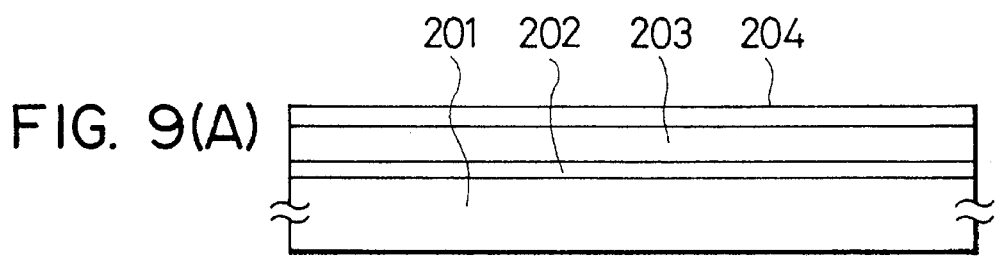
FIGS. 9(A) through 9(D) are cross-sectional views illustrating a manufacturing process according to a sixth preferred embodiment of the invention.
Figure 9B:
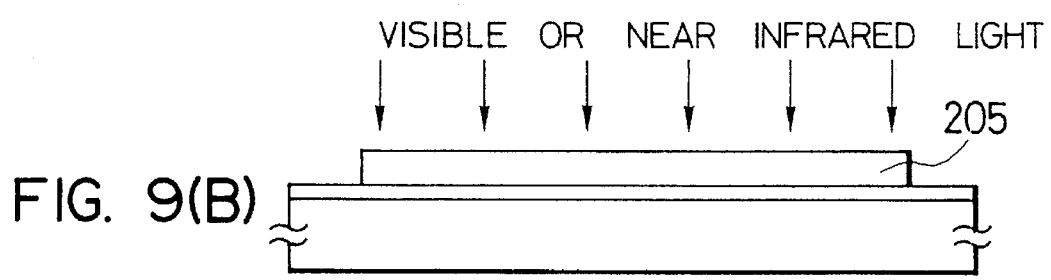
Figure 9C:
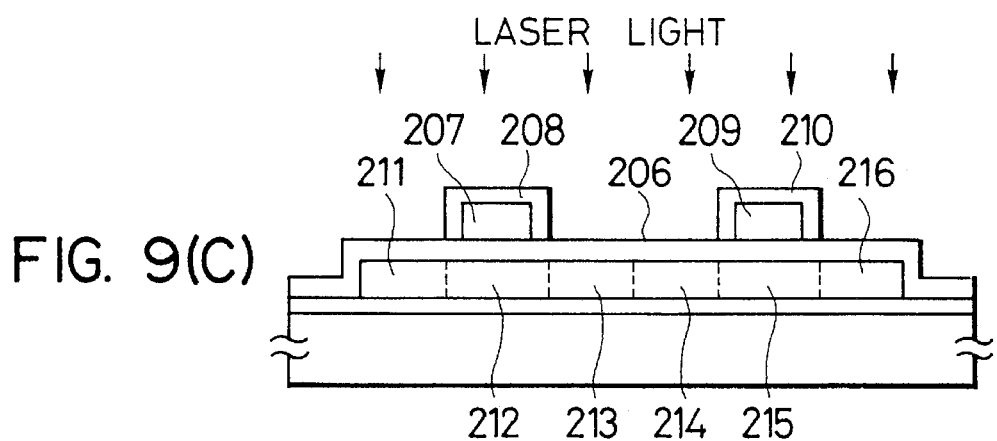
Figure 9D:
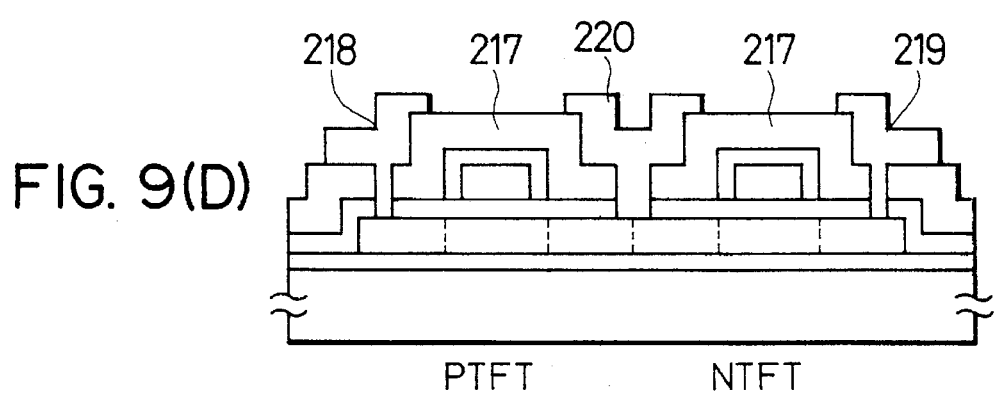

A silicon oxide film 39 of thickness of 6000 Å was then formed as an interlayer insulator by plasma CVD, contact holes were formed in this, and TFT source region and drain region electrodes/leads 40a, 40b were formed using a metallic material, for example a multilayer film of titanium nitride and aluminum. Finally, annealing was carried out in hydrogen at one atmosphere and at 350° C. for 30 minutes. By the process described above a TFT was completed. (FIG. 3(E))

Second Preferred Embodiment

A manufacturing process according to a second preferred embodiment of the invention is illustrated in FIGS. 12(A) through 12(E). First, a silicon oxide base film 42 of thickness of 2000 Å was formed on a substrate (Corning 7059) 41 by sputtering. Then, by plasma CVD, an intrinsic (I-type) amorphous silicon film of thickness of from 200 to 1500 Å, for example 500 Å, was deposited. This silicon film was patterned to form an island-shaped silicon film 43. Then, by laser annealing, the silicon region was crystallized. A KrF excimer laser (wavelength 248 nm) was used as the laser, the laser energy density was made 200 to 500 $mJ/cm^2$, for example 350 $mJ/cm^2$, and 2 to 10 shots, for example 2 shots, of irradiation were carried out per location. For the laser irradiation, the substrate was heated to 100° to 450° C., for example 350° C.

Then, with tetra-ethoxy-silane ($Si(OC_2H_5)_4$, TEOS) and oxygen as raw materials, a silicon oxide film 44 of thickness 1000 Å was formed by plasma CVD as a gate insulating film of a crystal silicon TFT. As a raw material, in addition to the gas mentioned above, trichloroethylene ($C_2HCl_3$) was used. Before the film was formed, 400 SCCM of oxygen was fed into a chamber, plasma was generated with the substrate temperature at 300° C. and the total pressure at 5 Pa and with an RF power of 150 W, and this state was maintained for 10 minutes. After that, 300 SCCM of oxygen, 15 SCCM of TEOS, and 2 SCCM of trichloroethylene were introduced into the chamber, and the silicon oxide film was formed. The substrate temperature, the RF power and the total pressure were 300° C., 75 W and 5 Pa respectively. After the film was formed, 100 Torr of hydrogen was introduced into the chamber and hydrogen annealing was carried out at 350° C. for 35 minutes.

Then, by sputtering, an aluminum film (first aluminum film) of thickness 200 to 2000 Å, for example 500 Å, was deposited. The purity of the aluminum was over 99.9%. Consecutively with this, an aluminum film (second aluminum film) containing 0.5 to 3%, for example 2% silicon was deposited to a thickness of 1000 to 10,000 Å, for example 5000 Å.

By sputtering, as an anti-reflection film, an amorphous silicon film of thickness 100 to 2000 Å, for example 200 Å, was then deposited. This multilayer film was then patterned to form a TFT gate electrode 45. An anti-reflection film 46 remained on the top of the gate electrode. Because of the presence of the anti-reflection film, it was possible for example to conduct fine patterning of even less than 7 μm with good precision. (FIG. 12(A))

Next, the surface of this gate electrode 45 and the anti-reflection film 46 were anodically oxidized to form an oxide layer (aluminum oxide and silicon oxide) 47 on the surface. The anodic oxidation was carried out in a 1 to 5% solution of tartaric acid in ethylene glycol. The anti-reflection film 46 was almost completely oxidized. Then, by ion implantation, an impurity (phosphorus) was implanted with the gate electrode as a mask. The acceleration voltage was made 80 kV, and the dose quantity was made $2 \times 10^{15}$ $cm^{-2}$. As a result, N-type impurity regions 48a, 48b were created. (FIG. 12(C))

After that, the anodic oxide 47 on the gate electrode and the silicon oxide film 44 (except that lying beneath the gate electrode) were removed. Then, with the specimen in this state, the impurity was activated by laser annealing. A KrF excimer laser (wavelength 248 nm, pulse width 20 nsec) was used as the laser, and the laser energy density was made 200 to 500 $mJ/cm^2$, for example 250 $mJ/cm^2$, and 2 to 10 shots, for example 2 shots, of irradiation were carried out per location. For the laser irradiation, the substrate was heated to 100° to 450° C., for example 250° C. In this way, the impurity was activated. (FIG. 12(D))

Next, a silicon oxide film 49 of thickness 2000 Å was formed as an interlayer insulator by plasma CVD with TEOS as a raw material, contact holes were formed in this, and source and drain electrodes/leads 50a, 50b were formed using a metal material, for example a multilayer film of titanium nitride and aluminum. By the above process a semiconductor circuit was completed. (FIG. 12(E))

The electric field effect mobility of the thin film transistors produced was such that with a gate voltage of 10 V and 70 to 100 $cm^2/Vs$ the threshold value was 2.5 to 4.0 V, and the leak current when a voltage of −20 V was impressed on the gate was less than $10^{-13}$ A.

Third Preferred Embodiment

A manufacturing process according to a third preferred embodiment of the invention is illustrated in FIGS. 4(A) through 4(F). First, a silicon oxide base film 412 of thickness 2000 Å was formed on a substrate (Corning 7059) 411 by sputtering. Then, by plasma CVD, an intrinsic (I-type) amorphous silicon film of thickness 500 to 1500 Å, for example 1500 Å, and, on top of that, by sputtering, a silicon oxide film of thickness 200 Å, were deposited. This amorphous silicon film was then crystallized by annealing in a nitrogen atmosphere at 600° C. for 48 hours.

After the crystallization step, the silicon film was patterned, an island-shaped silicon region 413 was formed, and by sputtering a silicon oxide film 414 of thickness 1000 Å was deposited as a gate insulating film. For the sputtering, silicon oxide was used as a target, the substrate temperature during sputtering was 200° to 400° C., for example 250° C., and the sputtering atmosphere was oxygen and argon in the ratio argon/oxygen=0 to 0.5, for example less than 0.1.

Then, by sputtering, an aluminum film 415 of thickness 1000 to 10,000 Å, for example 5000 Å, containing 0.5 to 3% silicon, for example 2% silicon, was deposited. It is desirable that this silicon oxide film and this aluminum film be formed in consecutive steps. (FIG. 4(A))

The aluminum film 415 was then etched with a mixed acid having phosphoric acid as its main component, and a gate electrode 415a was formed. As a result of this etching process a deposit 416 whose main component was silicon was left on top of the silicon oxide layer 414. (FIG. 4(B))

To deal with this, the deposit was etched by the substrate being immersed for 30 seconds in an acid mixture of constituent ratio hydrofluoric acid 1, nitric acid 200 and acetic acid 150. The substrate was then immersed in a solution of tartaric acid in ethylene glycol (1 to 5%, neutralized with ammonia), a current was passed through the gate electrode, and an anodic oxide layer (aluminum oxide) 417 was thereby caused to grow on the surface of the gate electrode. For the thickness of the anodic oxide, 1000 to 5000 Å, and especially 2000 to 3000 Å, was desirable. In this example the thickness was made 2500 Å. (FIG. 4(C))

Then, by plasma doping, an impurity (phosphorus) was introduced into the silicon region with the gate electrode and the anodic oxide thereon as a mask. Phosphine ($PH_3$) was used as the doping gas, and the accelerating voltage was made 60 to 90 kV, for example 80 kV. The dose quantity was $1\times10^{15}$ to $8\times10^{15}$ $cm^{-2}$, for example $2\times10^{15}$ $cm^{-2}$. As a result N-type impurity regions 418a, 418b were created. (FIG. 4(D))

After that, laser annealing was carried out by irradiation with laser light. A KrF excimer laser (wavelength 248 nm, pulse width 20 nsec) was used as the laser, but other lasers, for example an XeF excimer laser (wavelength 353 nm), an XeCl excimer laser (wavelength 308 nm), or an ArF excimer laser (wavelength 193 nm), may be used. The laser energy density was made 200 to 500 $mJ/cm^2$, for example 250 $mJ/cm^2$, and 2 to 10 shots for example 2 shots, of irradiation were carried out per location. For the laser irradiation, the substrate was heated to 100° to 450° C., for example 250° C. In this way, the impurity was activated. (FIG. 4(E))

A silicon oxide film 419 of thickness 6000 Å was then formed as an interlayer insulator by plasma CVD, contact holes were formed in this, and TFT source region and drain region electrodes/leads 420a, 420b were formed using a metallic material, for example a multilayer film of titanium nitride and aluminum. Finally, annealing was carried out in hydrogen at one atmosphere and at 350° C. for 30 minutes. By the process described above a TFT was completed. (FIG. 4(F))

Fourth Preferred Embodiment

A manufacturing process according to a fourth preferred embodiment of the invention is illustrated in FIGS. 5(A) through 5(F). First, a silicon oxide base film 522 of thickness 2000 Å was formed on a substrate (Corning 7059) 521 by sputtering. Then, by plasma CVD, an intrinsic (I-type) amorphous silicon film of thickness 200 to 1500 Å, for example 500 Å, was deposited. This silicon film was patterned to form an island-shaped silicon film 523. Then, by laser annealing, the silicon region was crystallized. A KrF excimer laser (wavelength 248 nm) was used as the laser, the laser energy density was made 200 to 500 $mJ/cm^2$, for example 350 $mJ/cm^2$, and 2 to 10 shots, for example 2 shots, of irradiation were carried out per location. For the laser irradiation, the substrate was heated to 100° to 450° C., for example 350° C.

Then, with tetra-ethoxy-silane ($Si(OC_2H_5)_4$, TEOS) and oxygen as raw materials, a silicon oxide film 524 of thickness 1000 Å was formed by plasma CVD as a gate insulating film of a crystal silicon TFT. As a raw material, in addition to the gas mentioned above, trichloroethylene ($C_2HCl_3$) was used. Before the film was formed, 400 SCCM of oxygen was fed into a chamber, plasma was generated with the substrate temperature at 300° C. and the total pressure at 5 Pa and with an RF power of 150 W, and this state was maintained for 10 minutes. After that, 300 SCCM of oxygen, 15 SCCM of TEOS, and 2 SCCM of trichloroethylene were introduced into the chamber, and the silicon oxide film was formed. The substrate temperature, the RF power and the total pressure were 300° C., 75 W and 5 Pa respectively. After the film was formed, 100 Torr of hydrogen was introduced into the chamber and hydrogen annealing was carried out at 350° C. for 35 minutes.

Then, by sputtering, an aluminum film 525 containing 0.5 to 3% silicon, for example 2% silicon was deposited to a thickness of 1000 to 10,000 Å, for example 5000 Å. (FIG. 5(A))

The aluminum film 525 was then etched with a mixed acid having phosphoric acid as its main component, and a gate electrode 525a was formed. As a result of this etching process a deposit 526 whose main component was silicon was left on top of the silicon oxide layer 524. (FIG. 5(B))

To deal with this, the deposit was etched by the substrate being immersed for 30 seconds in an acid mixture of constituent ratio hydrofluoric acid 1, nitric acid 200 and acetic acid 150. The substrate was then immersed in a solution of tartaric acid in ethylene glycol (1 to 5%, neutralized with ammonia), a current was passed through the gate electrode, and an anodic oxide layer (aluminum oxide) 527 was thereby caused to grow on the surface of the gate electrode. For the thickness of the anodic oxide, 1000 to 5000 Å, and especially 2000 to 3000 Å, was desirable. In this example the thickness was made 2500 Å. (FIG. 5(C))

Then, by plasma doping, an impurity (phosphorus) was introduced into the silicon region with the gate electrode and the anodic oxide thereon as a mask. Phosphine ($PH_3$) was used as the doping gas, and the accelerating voltage was made 60 to 90 kV, for example 80 kV. The dose quantity was $1 \times 10^{15}$ to $8 \times 10^{15}$ $cm^{-2}$, for example $2 \times 10^{15}$ $cm^{-2}$. As a result N-type impurity regions 528a, 528b were created. (FIG. 5(D))

After that, using an etchant whose main component was hydrofluoric acid, all or part of the anodic oxide 527 and the silicon oxide film 524 were etched and the surface of the silicon region 523 was thereby exposed. In particular, the boundary between the impurity region 528 and the active region (the intrinsic semiconductor region) was exposed. Laser annealing was then carried out by irradiation with laser light. A KrF excimer laser (wavelength 248 nm, pulse width 20 nsec) was used as the laser. The laser energy density was made 200 to 500 $mJ/cm^2$, for example 250 $mJ/cm^2$, and 2 to 10 shots, for example 2 shots of irradiation were carried out per location. For the laser irradiation, the substrate was heated to 100° to 450° C., for example, 250° C. In this way the impurity was activated. (FIG. 5(C))

A silicon oxide film 529 of thickness 6000 Å was then formed as an interlayer insulator by plasma CVD, contact holes were formed in this, and TFT source region and drain region electrodes/leads 530a, 530b were formed using a metallic material, for example a multilayer film of titanium nitride and aluminum. Finally, annealing was carried out in hydrogen at one atmosphere and at 350° C. for 30 minutes. By the process described above a TFT was completed. (FIG. 5(F))

The electric field effect mobility of the thin film transistors produced was such that with a gate voltage of 10 V and 70 to 100 $cm^2/Vs$ the threshold value was 2.5 to 4.0 V, and the leak current when a voltage of −20 V was impressed on the gate was less than $10^{-13}$ A.

Fifth Preferred Embodiment

A manufacturing process according to a fifth preferred embodiment of the invention is illustrated in FIGS. 6(A) through 6(E). First, a silicon oxide base film 612 of thickness 2000 Å was formed on a substrate (Corning 7059) 611 by sputtering. Then, by plasma CVD, an intrinsic (I-type) amorphous silicon film of thickness 500 to 1500 Å, for example 1500 Å, and, on top of that, by sputtering, a silicon oxide film of thickness 200 Å, were deposited. This amorphous silicon film was then crystallized by annealing in a nitrogen atmosphere at 600° C. for 48 hours.

This step may be carried out using laser annealing. As the laser, any of the excimer lasers can be used. The laser energy density should be made 200 to 500 $mJ/cm^2$, for example 350 $mJ/cm^2$; 2 to 10 shots of irradiation should be carried out per location, and the substrate should be heated to 100° to 450° C. for the laser irradiation.

After the crystallization step, the silicon film was patterned, an island-shaped silicon region 613 was formed, and by sputtering a silicon oxide film 614 of thickness 1000 Å was deposited as a gate insulating film. For the sputtering, silicon oxide was used as a target, the substrate temperature during sputtering was 200° to 400° C., for example 250° C., and the sputtering atmosphere was oxygen and argon in the ratio argon/oxygen=0 to 0.5, for example less than 0.1.

Then, by sputtering, an aluminum film containing 0.5 to 3% silicon, for example 2% silicon, of thickness 1000 to 10,000 Å, for example 5000 Å, was deposited. It is desirable that this silicon oxide film and this aluminum film be formed in consecutive steps. The aluminum film was then patterned to form a gate electrode 615. Instead of aluminum, other metals and semiconductor materials such as silicon, titanium, tantalum, molybdenum or tungsten, or silicides of these, may be used. Also, this does not have to be a single-layer film, and may instead be a multilayer film consisting of different films superposed. (FIG. 6(A))

The substrate was then immersed in a solution of tartaric acid in ethylene glycol (1 to 5%, neutralized with ammonia), a current was passed through the gate electrode, and an anodic oxide (aluminum oxide) layer 616 was thereby caused to grow on the surface of the gate electrode. For the thickness of the anodic oxide, 1000 to 5000 Å, and especially 2000 to 3000 Å, was desirable. In this example the thickness was made 2500 Å. (FIG. 6(B))

Then, by ion doping, an impurity (phosphorus) was introduced into the silicon region with the gate electrode and the anodic oxide thereon being used as a mask. Phosphine ($PH_3$) was used as the doping gas, and the accelerating voltage was made 60 to 90 kV, for example 80 kV. The dose quantity was $1 \times 10^{15}$ to $8 \times 10^{15}$ $cm^{-2}$, for example $2 \times 10^{15}$ $cm^{-2}$. As a result, N-type impurity regions 617a, 617b were created. (FIG. 6(C))

A silicon oxide film 618 of thickness 6000 Å was then formed as an interlayer insulator by plasma CVD, and contact holes 619a, 619b were formed in this silicon oxide film 618. After that, laser annealing was carried out by irradiation with laser light. A KrF excimer laser (wavelength 248 nm, pulse width 20 nsec) was used as the laser, but other lasers, for example an XeF excimer laser (wavelength 353 nm), an XeCl excimer laser (wavelength 308 nm), or an ArF excimer laser (wavelength 193 nm) may be used. However, it is necessary that the laser light satisfactorily permeate the interlayer insulator 618. The laser energy density was made 200 to 500 $mJ/cm^2$, for example 250 $mJ/cm^2$, and 2 to 10 shots, for example 2 shots, of irradiation were carried out per location. For the laser irradiation, the substrate was heated to 100° to 450° C., for example 250° C. In this way, the impurity was activated. (FIG. 6(D))

Finally, TFT source region and drain region electrodes/ leads 620a, 620b were formed using a metallic material, for example a multilayer film of titanium nitride and aluminum. Removing the natural oxide film of silicon which had formed on the contact portions by cleaning the substrate with dilute hydrofluoric acid before depositing the metallic material made it possible to form more complete contacts. Finally, annealing was performed in hydrogen at 1 atmosphere and at 350° C. for 30 minutes. By the above process, a thin film transistor was completed. (FIG. 6(E))

Sixth Preferred Embodiment

This preferred embodiment is an example of the creation of a circuit, shown in FIGS. 9(A) through 9(D), using a crystalline silicon film formed on a glass substrate 201, wherein a P-channel TFT (a PTFT) and an N-channel TFT (an NTFT) are combined complimentarily. The structure of this preferred embodiment can be applied to pixel electrode switching elements and peripheral driving circuits in active liquid crystal devices and also to image sensors and 3-dimensional integrated circuits.

A manufacturing process according to this sixth preferred embodiment of the invention is illustrated in FIGS. 9(A) through 9(D). First, a silicon oxide base film 202 of thickness 2000 Å was formed on a substrate (Corning 7059) 201 by sputtering. If before the base film is formed the substrate is annealed at a temperature higher than its distortion temperature and then gradually cooled at 0.1° to 1.0° C./minute to below the distortion temperature, shrinkage of the substrate during subsequent steps (including for example infrared light irradiation) accompanying temperature increases is slight and mask alignment becomes easy. In the case of a Corning 7059 substrate it is to be recommended that the substrate be annealed at 620° to 660° C. for 1 to 4 hours, gradually cooled at 0.1° to 1.0° C./minute, preferably 0.03° to 0.3° C./minute, and taken out when its temperature has fallen to 400° to 500° C.

Then, by plasma CVD or reduced pressure CVD, an intrinsic (I-type) noncrystalline silicon film 203 of thickness 300 to 1500 Å, for example 800 Å, was formed. On top of that a silicon oxide film 204 or a silicon nitride film 204 of thickness 100 to 800 Å, for example 200 Å, was deposited by plasma CVD. This serves as a protective film in a heat annealing step to be described below, and prevents roughing of the film surface.

Next, heat annealing was carried out in a nitrogen atmosphere (at atmospheric pressure) at 600° C. for 48 hours. This heat annealing caused the noncrystalline silicon film 203 to crystallize and become a crystalline silicon film. To increase this crystallinity further it is effective to implant silicon ions at a dose quantity of $1 \times 10^{14}$ to $1 \times 10^{16}$ cm$^{-2}$ by ion doping in advance. (FIG. 9(A)) Another effective way of increasing the crystallinity is to carry out crystallization using laser light or using RTP (Rapid Thermal Process).

After this step, the silicon film was patterned to form a TFT island-shaped active layer 205. The size of the active layer 205 is decided in consideration of the channel length and the channel width of the TFT. In small TFTs this was 50 µm×20 µm, and in large TFTs this was 100 µm×1000 µm. Many such active layers were formed on the substrate.

Then, irradiation with infrared light having a peak at 0.6 to 4 µm, in this example 0.8 to 1.4 µm, was carried out for 30 to 180 seconds to promote the crystallization of the active layer. The temperature was made 800° to 1300° C., typically 900° to 1200° C., for example 1100° C. In order to improve the condition of the surface of the active layer, the irradiation was performed in an H$_2$ atmosphere. In this step, because the active layer is heated selectively, it is possible to minimize the application of heat to the glass substrate. The step is extremely effective in reducing faults and dangling bonds in the silicon film. (FIG. 9(B))

A halogen lamp was used as the infrared light source. The strength of the visible/near-infrared light was adjusted so that the temperature on a monitor single-crystal silicon wafer was 800° to 1300° C. and typically between 900° and 1200° C. Specifically, the temperature of a thermocouple inlaid in the silicon wafer was monitored and this was fed back to the infrared light source. The temperature of the silicon surface on the glass substrate was estimated to be about ⅔ of this.

It is desirable that for the infrared light irradiation a silicon oxide or silicon nitride film be formed on the surface as a protective film. This is in order to improve the state of the surface of the silicon film 205. In this preferred embodiment, in order to improve the state of the surface of the silicon film 205, the irradiation was performed in an H$_2$ atmosphere; however, 0.1 to 10 vol % HCl, or hydrohalogen or compounds of fluorine or chlorine, bromine, etc, may be mixed into the H$_2$ atmosphere.

In this visible/near-infrared light irradiation, because the crystallized silicon film is heated selectively, it is possible to minimize the application of heat to the glass substrate. The step is extremely effective in reducing faults and dangling bonds in the silicon film. Performing hydrogen annealing at 200° to 500° C., typically 350° C., after the RTA step is finished is also is effective in reducing faults. The same effects can be obtained by carrying out doping of a quantity of $1 \times 10^{13}$ to $1 \times 10^{15}$ cm$^{-2}$ hydrogen ions and then performing heat treatment at 200° to 300° C.

After the RTA process, a silicon oxide film 206 of thickness 1000 Å was formed by plasma CVD as a gate insulating layer. As the raw material gas of the CVD, TEOS (tetra-ethoxy-silane (Si(OC$_2$H$_5$)$_4$) and oxygen were used, and the substrate temperature during film-forming was made 300° to 550° C., for example 400° C.

After this silicon film 206 was formed to serve as a gate insulating layer, light-annealing with visible/near-infrared rays was again carried out, under the same conditions as those used for the RTA process described above and in an atmosphere of N$_2$O or NH$_3$. By this annealing it was possible to eliminate levels mainly at and near the interface between the silicon oxide film 206 and the silicon film 205. This is extremely useful for insulated gate field effect semiconductor devices, because in these devices the characteristics of the interface between the gate insulating film and the channel-forming region are extremely important.

Then, by sputtering, an aluminum film of thickness 3000 to 8000 Å, for example 6000 Å, was formed. In this aluminum is contained 0.2 wt % Sc. As materials which this aluminum can be made to contain, rare earth elements of periodic table group IIIa can be used. The contained quantity can be made 0.05 to 0.40 wt %, preferably 0.1 to 0.25 wt %.

The aluminum film was then patterned and etched to form gate electrodes 207, 209. For the etching, dry etching was used. Then, the surfaces of these aluminum electrodes were anodically oxidized, and an oxide layer 208, 210 was formed surface of each electrode. This anodic oxidization was carried out in a 1 to 5% solution of tartaric acid in ethylene glycol. Anodic oxidation was brought about by raising the voltage to 150 V at 4 V/min.

The thickness of the oxide layers 208, 210 obtained was 2000 Å. Because the thickness of these oxides 208 and 210 creates offset gate regions in the subsequent ion doping step, the length of the offset gate regions can be set in the anodic oxidation step mentioned above.

Next, by ion doping (also called plasma doping), with the gate electrode parts (i.e. the gate electrode 207 and the oxide layer 208 on the periphery thereof, and the gate electrode 209 and the oxide layer 210 on the periphery thereof) as masks, impurities imparting P and N conductivity types were added to the silicon film 205 in a self-aligning manner. As the doping gas, phosphine (PH$_3$) and diborane (B$_2$H$_6$) were used; with the former the accelerating voltage was made 60 to 90 kV, for example 80 kV, and with the latter the accelerating voltage was made 40 to 80 kV, for example 65 kV. The doping quantity was made $1 \times 10^{14}$ to $1 \times 10^{15}$ cm$^{-2}$, for example $2 \times 10^{15}$ cm$^{-2}$ of phosphorus and $5 \times 10^{15}$ of boron. In the doping, by covering one of the regions with a photoresist, the respective elements were selectively doped. As a result, N-type impurity regions 214 and 216, and P-type impurity regions 211 and 213 were formed, and a P-channel TFT (PTFT) region and an N-channel TFT (NTFT) region could be created.

After that, annealing by irradiation with laser light was carried out. A KrF excimer laser (wavelength 248 nm, pulse width 20 nsec) was used as the laser, but other lasers may be used. The laser light irradiation conditions were that the laser energy density was made 200 to 400 mJ/cm$^2$, for example 250 mJ/cm$^2$, and 2 to 10 shots, for example 2 shots, of irradiation were carried out per location. The substrate may be heated to 200° to 450° C. for this laser light irradiation to increase the effect of the irradiation. (FIG. 9(C))

This step may alternatively be performed by a method using lamp annealing with visible/near-infrared light. Visible/near-infrared light is easily absorbed by crystallized silicon and by noncrystalline silicon to which phosphorus or boron has been added to a concentration of $10^{17}$ to $10^{21}$ cm$^{-3}$, and annealing of effectiveness comparable to that of thermal annealing can be carried out. When phosphorus or boron has been added, because of the dispersion of this impurity, even near-infrared light is well absorbed. This can be easily conjectured from the fact that the film is black in color even to the naked eye. As another result of this, because light is not readily absorbed to the glass substrate and therefore the glass substrate is not heated to a high temperature, and because the treatment can be completed in a short time, the method can be said to be ideal for processes in which shrinkage of the glass substrate is a problem.

A silicon oxide film 217 of thickness 6000 Å was then formed as an interlayer insulator by plasma CVD. Polyimide or a 2-layer film of silicon oxide and polyimide can alternatively be used as this interlayer insulator. Contact holes were formed, and TFT electrodes/leads 218, 220, 219 were formed using a metallic material, for example a multilayer film of titanium nitride and aluminum. Finally, annealing was carried out in hydrogen at one atmosphere and at 350° C. for 30 minutes, and a semiconductor circuit comprising complimentarily structured TFTs was completed. (FIG. 9(D))

The circuit described above is a structure in which a PTFT and an NTFT are provided complimentarily; however, it is also possible in the above process to make two TFTs simultaneously and then cut them apart down the middle, thereby producing two independent TFTs at one time.

Seventh Preferred Embodiment

A manufacturing process according to a seventh preferred embodiment of the invention is illustrated in FIGS. 10(A) through 10(E). First, a base film 302 comprising aluminum nitride of thickness 2000 Å and on top of that a silicon oxide film of thickness 200 Å was formed on a substrate (Corning 7059) 301 by sputtering. Then, by plasma CVD, an intrinsic (I-type) amorphous silicon film of thickness 500 to 1500 Å, for example 1500 Å, was deposited. Then, by sputtering, a silicon oxide film of thickness 200 Å was deposited on the amorphous silicon film.

This amorphous silicon film was then crystallized by annealing in a nitrogen atmosphere at 600° C. for 48 hours. After annealing, the silicon film was patterned to form an island-shaped silicon region 303, and then by sputtering a silicon film 304 of thickness 1000 Å was deposited as a gate insulating film. For the sputtering, silicon oxide was used as a target, the substrate temperature during sputtering was 200° to 400° C., for example 250° C., and the sputtering atmosphere was oxygen and argon in the ratio argon/oxygen=0 to 0.5, for example less than 0.1.

Then, by sputtering, an aluminum film of thickness 3000 to 8000 Å, for example 4000 Å, was deposited. To the aluminum, 0.05 to 0.4 wt %, for example 0.15 wt % scandium (Sc) was added. On top of this aluminum film a photoresist having good resistance to pressure, such as Shipley Co.'s AZ1350, of thickness approximately 1 μm, was formed by spin-coating. Then, by a known photolithography method, a gate electrode 305 was patterned. For the etching, wet etching was employed, and a mixture of phosphoric acid and nitric acid was used as the etchant. As a result of this a photoresist mask 306 was left on the top of the gate electrode. Instead of the photoresist, for example a photosensitive polyimide such as Toray Co.'s UR3800 (Photoneece) can be used to obtain a similar structure. (FIG. 10(A))

Next, by immersing the substrate in a 10% aqueous citric acid solution and performing anodic oxidation at a fixed voltage of 10 to 50 V, for example 10 V, for 10 to 50 minutes, for example 30 minutes, a porous anodic oxide 307 of thickness of from 4000 to 10,000 Å (1 μm), and in this example approximately 5000 Å, could be formed on the side surface of the gate electrode with a precision of ±200 Å. Alternatively, anodic oxidation may be performed in 8% oxalic acid solution at 30 to 40 V. Because the mask material was still in place on the upper surface of the gate electrode, almost no anodic oxidation proceeded there. (FIG. 10(B))

Next, the mask material was removed, the upper surface of the gate electrode was exposed, the substrate was immersed in a solution of tartaric acid in ethylene glycol (pH-adjusted to neutral with ammonia), a current was passed through the gate electrode, the voltage was increased at 1 to 5 V/min, for example 4 V/min, to 80 V, and anodic oxidation was thereby performed. In this step not only the upper surface of the gate electrode but also the side surface of the gate electrode was anodically oxidized, and a dense anodic oxide 308 was formed to a thickness of 1000 Å. The voltage withstand of this anodic oxide was more than 50 V. (FIG. 10(C))

Next, by plasma doping, an impurity (phosphorus) was introduced into the silicon region 303 with the gate electrode as a mask. Phosphine (PH$_3$) was used as the doping gas, and the accelerating voltage was made 60 to 90 kV, for example 80 kV. The dose quantity was $1\times10^{14}$ to $8\times10^{15}$ cm$^{-2}$, for example $2\times10^{15}$ cm$^{-2}$. As a result, N-type impurity regions 309 were created. (FIG. 10(D))

Next, laser annealing was carried out by irradiation from above with laser light, and the doped impurity was thereby activated. A KrF excimer laser (wavelength 248 nm, pulse width 30 nsec) was used as the laser, but other lasers, for example an XeCl excimer laser (wavelength 308 nm), an ArF excimer laser (wavelength 193 nm), or an XeF excimer laser (wavelength 353 nm), may be used.

The laser energy density was made 200 to 400 mJ/cm$^2$, for example 250 mJ/cm$^2$, and 2 to 10 shots, for example 2 shots, of irradiation were carried out. For the laser irradiation, the substrate was heated to 200° to 300° C., for example 250°

Figure 10A:
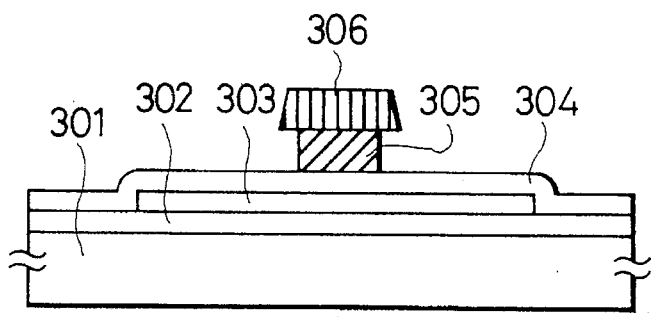
FIGS. 10(A) through 10(E) are cross-sectional views illustrating a manufacturing process according to a seventh preferred embodiment of the invention.
Figure 10B:
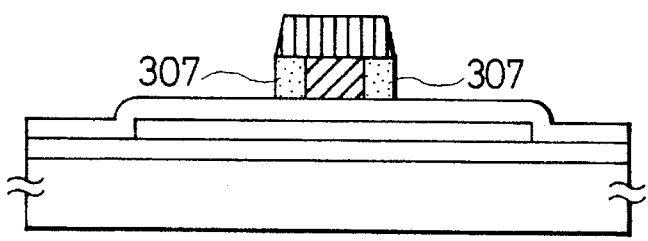
Figure 10C:
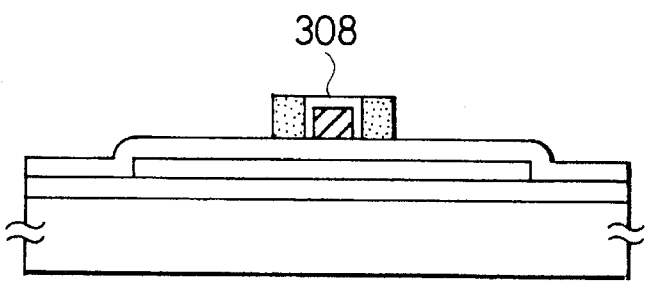
Figure 10D:
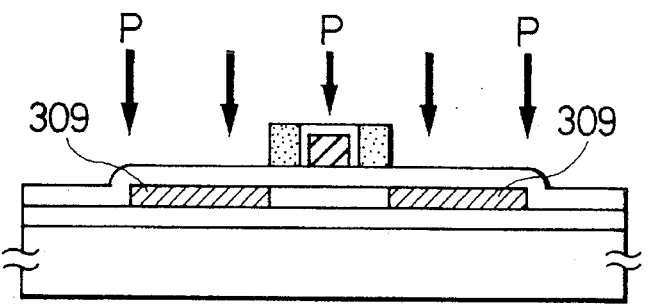
Figure 10E:
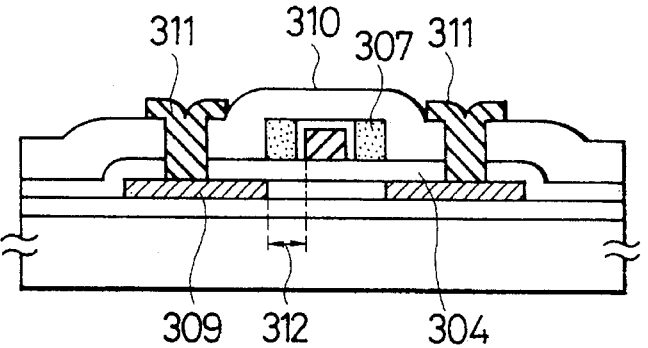

C. In this way, the impurity regions 309 were activated. In FIG. 10(D) the porous anodic oxide 307 is still present, but this oxide 307 may be removed hereafter. Also, the gate insulating film beneath the gate electrode and the gate insulating film 304 below that may be removed. When this is done, the porous anodic oxide 307 does not capture electric charges and cause instability.

A silicon oxide film 310 of thickness 6000 Å was then formed as an interlayer insulator by plasma CVD, contact holes were formed in this, and TFT source region and drain region electrodes/leads 311 were formed using a metallic material, for example a multilayer film of titanium nitride and aluminum. Finally, annealing was carried out in hydrogen at one atmosphere and at 350° C. for 30 minutes. By the process described above a TFT was completed. (FIG. 10(E))

In this preferred embodiment, unlike the sixth preferred embodiment, the TFT offset (the distance between the edges of the gate electrode 305 and the source/drain regions 307) was as much as 5000 Å (porous anodic oxide 3000 Å+non-porous anodic oxide 1000 Å), and as a result the leak current ($I_{OFF}$) was kept extremely low.

Also, because no excessive voltage was impressed on the gate insulating film during the anodic oxidation, the interface level density of the gate insulation film was low, and as a result a characteristic with a steep start-up was obtained. Thus, because the ON/OFF ratio of a TFT made according to this preferred embodiment is large and the leak current is small, the TFT is suitable for use for example as a pixel transistor in an active matrix-type liquid crystal display.

Eighth Preferred Embodiment

This preferred embodiment is a comparison example comparing a case wherein by an anodic oxidation step an anodic oxide layer is formed to a thickness of 2000 Å on the surface of an aluminum film to which 0.2 wt % Si has been added with a case wherein by an anodic oxidation step under the same conditions an anodic oxide layer is formed on the surface of an aluminum film to which 0.2 wt % Sc has been added.

The thickness of the aluminum film was 6000 Å, and the film was formed by sputtering. The anodic oxidation step was the same as that described in the sixth preferred embodiment: by immersing the aluminum film in a 1 to 5% solution of tartaric acid in ethylene glycol and increasing the voltage at 4 V/min to 150 V, an oxide film of thickness 2000 Å was formed.

Figure 11A:
FIGS. 11(A) and 11(B) are photographs showing the state of a thin film formed by anodic oxidation.

An electron microscope cross-section photograph taken in the case wherein Si was added to the aluminum is shown in FIG. 11(A). FIG. 11(A) shows the state of a film whose main component is aluminum, formed in an island-shape, and an oxide layer formed thereon in the anodic oxide step.

As can be seen in FIG. 11(A), abnormal growth is visible in the surface of the oxide layer, and the surface is not smooth. Furthermore, it can be seen that the film quality is also extremely poor.

Figure 11B:
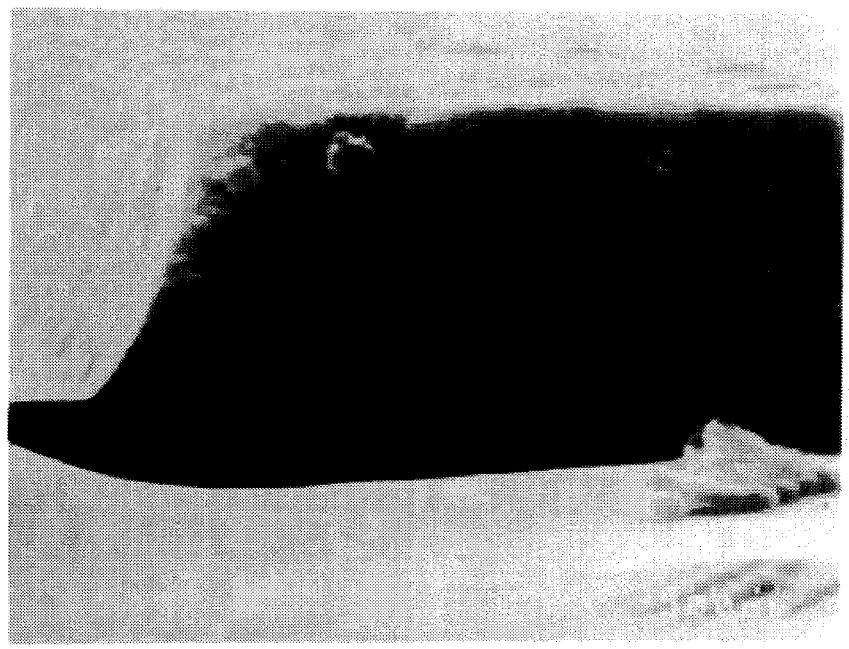
Figure 12A:
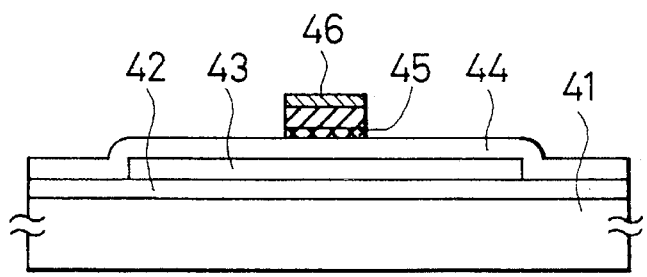
FIGS. 12(A) through 12(E) are cross-sectional views illustrating a manufacturing process according to a second preferred embodiment of the invention.
Figure 12B:
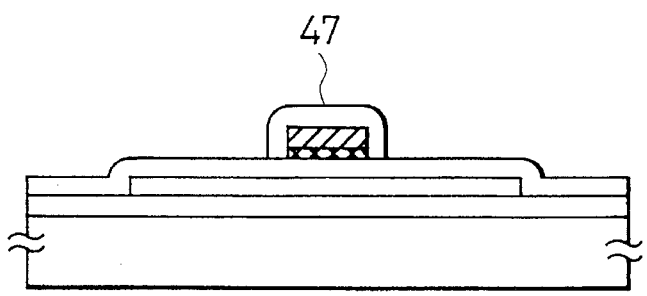
Figure 12C:
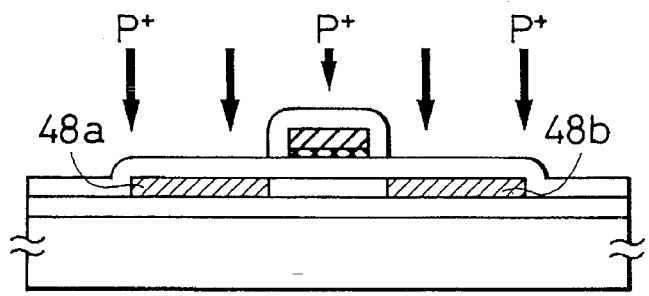
Figure 12D:
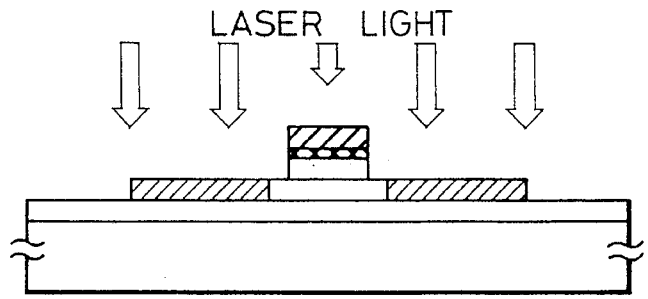
Figure 12E:
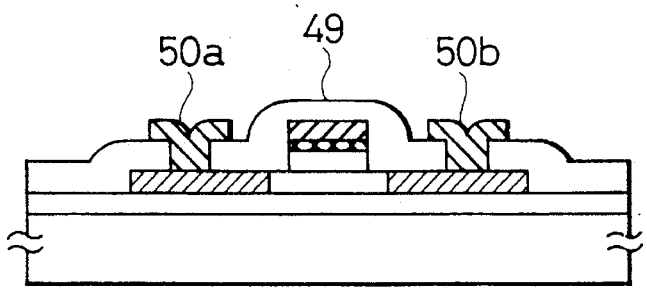

That shown in FIG. 11(B), on the other hand, is an electron microscope photograph taken in the case wherein Sc was added to the aluminum. From FIG. 11(B) it can be seen that the oxide layer is dense and that there is no trace of any abnormal growth in the surface.

As described above, by adding Sc to the aluminum it is possible by anodic oxidation of the surface of the aluminum to create a dense oxide layer and to do so with good controllability.

In the anodic oxidation process, in forming an anodic oxide layer on the surface of the aluminum, by adding to the aluminum 0.05 wt % to 0.40 wt % Sc, preferably 0.1 wt % to 0.25 wt % Sc, the following effects can be obtained:

(1) Abnormal growth (hillocks) of the regions oxidized can be prevented.

(2) It is possible to raise the precision with which the thickness of aluminum that is oxidized can be controlled.

(3) A uniform anodic oxide layer can be formed.

(4) The heat-resistance can be increased.

(5) The laser-resistance can be increased.

(6) Especially when TFT offset regions are formed, the TFT characteristics can be made uniform.

(7) Because there is no abnormal growth, and a dense oxide layer can be formed, it is possible to form a thin oxide layer.

Furthermore, using this invention it was possible to obtain a TFT having a metal gate of which the main component was aluminum. The heat-resistance of the gate electrode of this invention is excellent, and hillocks do not readily form. As a result, great benefits can be achieved through the use of fine patterns of less than 10 µm and especially less than 7 µm.

Furthermore, using this invention it was possible to obtain a TFT having good source and drain contacts. As a result, it was possible to greatly increase the manufacturing yield of TFTs and to markedly reduce variations in quality. Thus, the invention is of value to industry.

What is claimed is:

1. A method of forming a transistor comprising:

forming an aluminum film having a thickness of 2000 to 10000 Å and containing a Group IIIb element of the Periodic Table;

patterning said aluminum film by etching; and removing a residue comprising said Group IIIb element produced by said patterning step.

2. The method of claim 1, wherein said Group IIIb element is contained in said aluminum film at 0.05 wt % to 0.40 wt %.

3. The method of claim 1, wherein said Group IIIb element is selected from the group consisting of Sc, Y, a lanthanoid and an actinoid.

4. A method of forming a transistor comprising:

forming an aluminum film having a thickness of 2000 to 10000 Å and containing a Group IIIb element of the Periodic Table;

patterning said aluminum film by etching;

removing a residue comprising said Group IIIb element produced by said patterning step; and anodic oxidizing a surface of the patterned aluminum film.

5. The method of claim 4, wherein said Group IIIb element is contained in said aluminum film at 0.05 wt % to 0.40 wt %.

6. The method of claim 4, wherein said Group IIIb element is selected from the group consisting of Sc, Y, a lanthanoid and an actinoid.

7. A method of forming a transistor comprising:

forming an aluminum film having a thickness of 2000 to 10000 Å and containing a Group IIIb element of the Periodic Table;

forming a gate electrode by etching said aluminum film; and removing a residue comprising said Group IIIb element produced by said gate electrode forming step.

8. The method of claim 4, wherein said Group IIIb element is selected from the group consisting of Sc, Y, a lanthanoid and an actinoid.

9. A method of forming a transistor comprising:

forming an aluminum film having a thickness of 2000 to 10000 Å and containing a Group IIIb element of the Periodic Table;

forming a gate electrode by etching said aluminum film;

removing a residue comprising said Group IIIb element produced by said gate electrode forming step; and anodically oxidizing a surface of said gate electrode.

10. The method of claim 9, wherein said Group IIIb element is contained in said aluminum film at 0.05 wt % to 0.40 wt %.

11. The method of claim 9, wherein said Group IIIb element is selected from the group consisting of Sc, Y, a lanthanoid and an actinoid.

* * * * *